(12) United States Patent
Sambucetti et al.

(10) Patent No.: US 6,335,104 B1
(45) Date of Patent: Jan. 1, 2002

(54) METHOD FOR PREPARING A CONDUCTIVE PAD FOR ELECTRICAL CONNECTION AND CONDUCTIVE PAD FORMED

(75) Inventors: Carlos J. Sambucetti, Croton Hudson; Daniel C. Edelstein, New Rochelle; John G. Gaudiello, Poughkeepsie; Judith M. Rubino, Ossining; George Walker, New York, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/510,996

(22) Filed: Feb. 22, 2000

(51) Int. Cl.[7] .............................. B32B 15/00; B05D 5/12
(52) U.S. Cl. ........................ 428/615; 427/125; 427/437; 427/438; 428/637; 428/641; 428/655; 428/656; 428/670; 428/672; 428/673; 428/674; 428/675; 428/680; 428/686; 428/926; 428/936
(58) Field of Search .................. 428/615, 637, 428/641, 655, 656, 670, 672, 673, 674, 675, 680, 686, 926, 936; 427/125, 437, 438

(56) References Cited

U.S. PATENT DOCUMENTS 6,139,977 A * 10/2000 Abys et al. .................. 428/615

* cited by examiner

Primary Examiner—Robert R. Koehler
(74) Attorney, Agent, or Firm—Robert M. Trepp; Randy W. Tung

(57) ABSTRACT

A method for preparing a copper pad surface for electrical connection that has superior diffusion barrier and adhesion properties is provided. In the method, a copper pad surface is first provided that has been cleaned by an acid solution, a protection layer of a phosphorus or boron-containing metal alloy is then deposited on the copper pad surface, and then an adhesion layer of a noble metal is deposited on top of the protection layer. The protection layer may be a single layer, or two or more layers intimately joined together formed of a phosphorus or boron-containing metal alloy such as Ni-P, Co-P, Co-W-P, Co-Sn-P, Ni-W-P, Co-B, Ni-B, Co-Sn-B, Co-W-B and Ni-W-B to a thickness between about 1,000 Å and about 10,000 Å. The adhesion layer can be formed of a noble metal such as Au, Pt, Pd and Ag to a thickness between about 500 Å and about 4,000 Å.

45 Claims, 1 Drawing Sheet

METHOD FOR PREPARING A CONDUCTIVE PAD FOR ELECTRICAL CONNECTION AND CONDUCTIVE PAD FORMED

FIELD OF THE INVENTION

The present invention generally relates to a method for forming a conductive pad for electrical connection and pad formed and more particularly, relates to a method for forming a conductive copper pad surface for electrical connection to a wirebond or solder bump and conductive copper pad formed.

BACKGROUND OF THE INVENTION

In the fabrication of semiconductor devices, an integrated circuit (IC) chip may be assembled in a package in a final process step. The assembled package can then be connected to a printed circuit board as part of a large circuit. To establish electrical communication with the integrated circuit chip, a wire bonding process or a solder bumping process can be used to connect a multiplicity of bond pads on the IC chip to the outside circuitry.

In a typical IC chip, active circuit elements such as transistors, resistors, etc., are positioned in the central portion, i.e. the active region, of the chip while the bond pads are arranged around the periphery of the active region such that active circuit elements could not be damaged during a subsequent bonding process. When a wire bonding process is performed, the process entails the bonding of a gold or aluminum wire to a bond pad on the chip by fusing the two together with ultrasonic energy. The wire is then pulled away from the bond pad after the bond is formed. The wire pulling process frequently causes a defect known as bond pad lift-off. It occurs since during the process of attaching a gold wire to a bond pad, a high level of stress is placed on the bond pad, i.e. a relatively large, heavy bond is placed on layers which may have poor adhesion to the underlying layers.

For instance, one factor that affects adhesion between the layers is the common usage of a diffusion barrier layer formed of TiN for preventing aluminum diffusion into underlying conductive layers during subsequent high temperature processes. The diffusion barrier layer utilized, i.e. TiN, TiW or other suitable alloys, does not have a strong adhesion to the underlying oxide layer in the bond pad. This is one reason that leads to the bond pad lift-off defect. Other reasons such as the high bonding stress and the high pull force further contribute to the lift-off problem. Most lift-off problems occur at an interface between a sili conductive layer and an insulating (i.e. $SiO_2$) layer. "In addition to the wirebond process by aluminum or gold wires to form electrical connections, the solder bump (a.k.a. "C4") process has also been used for attaching a chip to a package for the transmission of electronic signals from the bond pads to the second level packaging or a circuit board. The solder bump process has been used more exclusively by IBM Corporation, while most of the IC industry has used the wirebond technology. In a conventional wirebond process, the bond pad on the chip surface is formed of aluminum which readily lends itself to the attachments of aluminum or gold wires by standard and highly automated tools. However, with the recent introduction of the copper technology where all the wiring of an IC chip back-end-of-line (BEOL) is copper wiring, both the solder bump and the aluminum or gold wirebond have been performed by direct processing on the copper bond pads, or by the addition of a suitable Al cap patterned on the Cu pad, with a suitable thin film barrier metal in-between the Al and Cu, to prevent their inter-diffusion (i.e. incorporated herein by reference, entitled "Robust Interconnect Structure", filed May 19, 1999)."

A direct wirebond on copper pads cannot be easily performed, since a wirebond formed on pure copper by either aluminum or gold wires is subjected to corrosion, oxidation and thermal diffusion problems. A direct wirebond to copper pads is unreliable and subject to fail. The Al pad cap technique adds significant cost, as it adds a lithographic pattern (mask) and etch cycle, in addition to the depositions. It is therefore of great commercial significance to offer a maskless solution to wirebond of copper bond pads, i.e. bond pads on copper chips that can be used in the IC industry.

It is therefore an object of the present invention to provide a method for preparing a conductive pad surface for electrical connection that does not have the drawbacks or shortcomings of the conventional methods.

It is another object of the present invention to provide a method for preparing a conductive pad surface for electrical connection by either a wirebond or a solder bumping process. "It is a further object of the present invention to provide a method for preparing a copper pad surface for electrical connection by first forming a protection layer and then an adhesion layer on the copper pad surface, both being done without requiring additional photomask and etching steps. (Incorporated herein by reference, entitled "Self-Aligned Corrosion Stop for Copper C4 and Wirebond", filed May 14, 1999.)"

It is another further object of the present invention to provide a method for preparing a copper pad surface for electrical connection by first depositing a protection film layer of a phosphorus or boron-containing metal alloy on the copper pad surface.

It is still another object of the present invention to provide a method for preparing a copper pad surface for electrical connection by depositing an adhesion layer of a noble metal on top of a protection layer previously formed on the copper pad surface.

It is yet another object of the present invention to provide a method for preparing a copper pad surface for electrical connection which further includes a step of depositing a nucleation layer of a noble metal on the copper pad surface prior to the deposition of the protection layer.

It is still another further object of the present invention to provide a conductive pad for forming an electrical connection thereon which includes a copper pad surface, a protection layer on the copper pad surface and an adhesion layer on top of the protection layer for providing electrical connection with a wirebond or a solder bump.

It is yet another further object of the present invention to provide an electrical structure for providing electrical connection which includes a copper pad surface, a protection layer on the copper pad surface, an adhesion layer on top of the protection layer, and an electrical connection of a wirebond or solder bump integrally formed with the adhesion layer.

SUMMARY OF THE INVENTION

In accordance with the present invention, a method for preparing a copper pad surface for electrical connection with a wirebond or a solder bump and devices formed by the method are provided.

In a preferred embodiment, a method for preparing a copper pad surface for electrical connection can be carried out by the operating steps of first providing a copper pad surface, depositing a protection layer of phosphorus or boron-containing metal alloy on the copper pad surface, and depositing an adhesion layer of a noble metal on top of the protection layer.

The method for preparing a copper pad surface for electrical connection may further include the step of depositing a nucleation layer of a noble metal on the copper pad surface prior to the deposition of the protection layer. The method may further include the steps of cleaning the copper pad surface in an acid solution, and depositing a nucleation layer of a noble metal on the copper pad surface. The nucleation layer may be deposited of palladium, or palladium nanoparticles. Pd nanoparticles are most commonly used although other nanoparticles of noble metals such as ruthenium and rhenium can be used. The method may further include the step of rinsing the copper pad surface with water after the nucleation layer is deposited, or the step of depositing the protection layer by an electroless plating technique. The step of depositing a protection layer may further include the steps of contacting the copper pad surface with a heated, buffered solution of an electroless bath that contains cobalt ions, tungstate ions, boric acid, citrate ions, lead acetate and hypophosphite; and then contacting the copper pad surface with a heated electroless solution that contains nickel ions, citrate ions, boric acid, sodium hypophosphite or dimethyl amino borane.

In the method for preparing a copper pad surface for electrical connection, the adhesion layer may be formed of a metal selected from the group consisting of Au, Pt, Pd and Ag. The adhesion layer may be formed by immersing the IC in an immersion Au solution. The adhesion layer may be formed of a noble metal to a thickness between about 500 Å and about 4,000 Å. The phosphorus or boron-containing metal alloy may be selected from the group consisting of Ni-P, Co-P, Co-W-P, Co-Sn-P, Ni-W-P, Co-B, Ni-B, Co-Sn-B, Co-W-B and Ni-W-B. The protection layer may be formed of the phosphorus or boron containing Co or Ni metal alloys to a thickness between about 1,000 Å and about 10,000 Å. The method may further include the step of depositing a noble metal layer by an electroless plating technique on top of the adhesion layer such that the total thickness of the noble metal layer is between about 2,000 Å and about 12,000 Å. The protection layer may further include two separate layers each being a phosphorus or boroncontaining metal alloy, for instance, the protection layer may be a composite layer of Co-W-P and Ni-P. The protection layer may further be Ni-P or Co-W-P, while the adhesion layer may be Au. The protection layer may further be Ni-P, while the adhesion layer is an immersion Au and electroless Pd. The method may further include the step of forming the copper pad on a substrate of a silicon wafer, a silicon-germanium wafer or a silicon-on-insulator wafer.

The method for preparing a copper pad surface for electrical connection may further include the steps of dicing a wafer in which the copper pad surface is situated into individual IC chips; and forming a wirebond onto the copper pad surface. The method may further include the steps of dicing a wafer on which the copper pad surface is situated into IC chips, and forming solder bumps on the copper pad surface for making electrical connections. The solder bumps formed may be Pb/Sn solder balls by evaporation, electroplating, screen printing or injection molding techniques.

The present invention is further directed to a conductive pad for forming an electrical connection thereon which includes a copper pad surface, a protection layer of phosphorus or boron-containing metal alloy on the copper pad surface, and an adhesion layer of a noble metal on top of the protection layer, wherein the adhesion layer provides electrical connection with a wirebond or a solder bump.

The conductive pad for forming an electrical connection thereon may further include a nucleation layer of a noble metal in-between the copper pad surface and the protection layer. The conductive pad may further include a nucleation layer of palladium, ruthenium or rhenium nanoparticles in-between the copper pad surface and the protection layer. The protection layer may be formed of a material selected from Ni-P, Co-P, Co-W-P, Co-Sn-P, Ni-W-P, Co-B, Ni-B, Co-Sn-B, Co-W-B and Ni-W-B. The protection layer may have a thickness between about 1,000 Å and about 10,000 Å, preferably about 3,000 Å. The conductive pad may further include a noble metal layer on top of the adhesion layer forming a combined thickness of the noble metal layer between about 2,000 Å and about 12,000 Å, preferably about 9,000 Å. The protection layer may further include two separate layers each being a phosphorus or boron-containing metal alloy intimately joined together. The two separate layers may be Co-W-P and Ni-P. The adhesion layer may be a layer selected from Au, Pt, Pd and Ag. The adhesion layer may have a thickness between about 500 Å and about 4,000 Å. The protection layer may be Ni-P or Co-W-P, while the adhesion layer may be Au. The protection layer may be Ni-P, while the adhesion layer may be an immersion Au and electroless Pd. The conductive pad may be formed on a substrate of a silicon wafer, a silicon-germanium wafer or a silicon-on-insulator wafer. The electrical connection may be formed of a wirebond or a solder bump.

The present invention is further directed to an electrical structure for providing electrical connection which includes a copper pad surface, a protection layer of phosphorus or boron-containing metal alloy on the copper pad surface, an adhesion layer of a noble metal on top of the protection layer, and an electrical connection integral with the adhesion layer. The electrical connection may be a wirebond or a solder bump.

The electrical structure for providing electrical connection may further include a nucleation layer of a noble metal in-between the copper pad surface and the protection layer, the nucleation layer may be formed of palladium, ruthenium or rhenium nanoparticles. The adhesion layer may be formed of a metal selected from Au, Pt, Pd and Ag. The protection layer may be formed of a metal alloy selected from the group consisting of Ni-P, Co-P, Co-W-P, Co-Sn-P, Ni-W-P, Co-B, Ni-B, Co-Sn-B, Co-W-B and Ni-W-B. The electrical structure may further include a noble metal layer deposited on top of the adhesion layer such that the total thickness of the noble metal layer is between about 2,000 Å and about 12,000 Å. The electrical structure may further include a substrate of silicon wafer, a silicon-germanium wafer or a siliconon-insulator wafer on which the copper pad is situated.

BRIEF DESCRIPTION OF THE DRAWINGS

These and other objects, features and advantages of the present invention will become apparent upon consideration of the specification and the appended drawings, in which.

DETAILED DESCRIPTION OF THE PREFERRED EMBODIMENT

Figure 1:
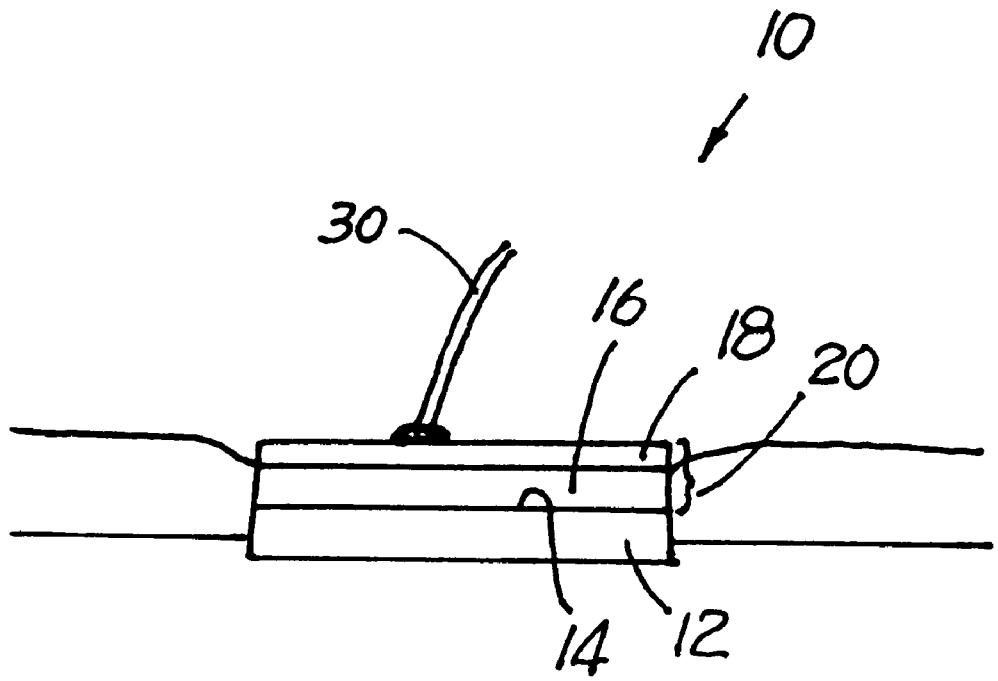
FIG. 1 is an enlarged, cross-sectional view of a present invention copper conductive pad with a wirebond connected on top.

The present invention discloses a method for preparing a copper pad surface for electrical connection by either a wirebond or a solder bump. The invention further discloses a copper conductive pad for forming an electrical connection thereon, and an electrical structure for providing an electrical connection that includes either a wirebond or a solder bump formed on top of a copper pad surface.

In the method for preparing a copper pad surface for electrical connection, a copper pad surface is first provided, a protection layer of phosphorus or boron-containing metal alloy is then deposited on the copper pad surface, and an adhesion layer of a noble metal is then deposited on the protection layer for making electrical connection with either a wirebond or a solder bump. The method may further include the step of first depositing a nucleation layer of a noble metal such as palladium on the copper pad surface prior to the deposition of the protection layer. Prior to the deposition of the nucleation layer, the copper pad surface may be cleaned by an acid solution. The protection layer is formed of a phosphorus or boron-containing metal alloy or Ni-P, Co-W-P. The protection layer is formed to a thickness between about 1,000 Å and about 10,000 Å, and preferably to a thickness between about 3,000 Å and about 7,000 Å.

The present invention provides a process which allows direct wirebonding of copper pads on an electronic chip by a self-aliqned, selective technique which deposits on the copper pads a composite metal barrier layer first. The barrier layer protects the copper surface against diffusion and corrosion while, at the same time, provides a reliable wirebonding capability. The process disclosed here can be used to deposit the barrier metallurgy on copper wafers, diced, and tested for the wirebonding qualities with satisfactory results.

The invention achieves wirebonding or solder bumping on copper pads by sequentially and selectively (maskiess) depositing on the copper surface a barrier metallurgy which allows at the same time, protection of the copper pad surface and reliable wirebonding properties. The invention therefore eliminates an otherwise necessary maskable alternative of depositing an aluminum layer on the copper pad by either evaporation or sputtering, i.e. an expensive alternative method. The barrier layer of the present invention can be deposited by an electroless plating technique which is selective and self-aligned. The invention therefore does not require any photoprocessing steps, and selectively (maskless) i.e. photolithographic steps, or expensive mask alignment procedures or expensive metal etching steps such as RIE of aluminum. The wirebonding or solder bumping of the copper/barrier layers provided by the present invention novel method provides numerous processing advantages which include superior adhesion to copper, prevention of diffusion of copper atoms through the barrier layer under heat treatment, protection of copper surface against corrosion, and deposition of a noble metal on the final top layer of the barrier which allows excellent adhesion and pull strength of an aluminum or gold wire attached to the copper pad.

In the present invention novel method, as shown in FIG. 1, the surface 14 of the copper pad 12 at the back-end-of-line (BEOL) of the copper chip process is first modified by a sequence of chemical steps. For instance, by the electroless deposition of a first copper diffusion barrier layer 16. The first diffusion barrier layer 16 is deposited of a metal alloy material such as a phosphorus or boron-containing alloy of Ni-P, Co-W-P, Co-Sn-P, Ni-W-P, Co-B, Ni-B, Co-Sn-B, Co-W-B and Ni-W-B. A suitable thickness for the first diffusion barrier layer may be between about 1,000 Å and about 10,000 Å, and preferably between about 3,000 Å and about 7,000 Å. In the context of this writing, the word "about" is to mean a value in the range of ±10% from the value given as an average.

After the first diffusion barrier layer 16 is deposited, a second layer 18 is deposited on top of the diffusion barrier layer 16 by an immersion deposition technique using an immersion Au solution. A suitable thickness for the second layer 18 is about 500 Å and about 4,000 Å, and preferably between about 1,000 Å and about 2,000 Å. The first diffusion barrier layer 16, i.e. a protection layer, and the second adhesion layer 18 are deposited as a dual-layer 20 which provides copper protection and a reliable wirebond structure. Alternatively, a third layer (not shown in FIG. 1) may be applied on top of the second layer 18 by an electroless Au deposition technique to increase the thickness of the final Au layer to between about 4,000 Å and about 10,000 Å, and preferably to between about 4,000 Å and about 6,000 Å. The purpose of the third layer of Au is to allow easier wirebonding parameters and greater wirebond adhesion strength.

The present invention diffusion barrier layer 16 is further formed in the following examples:

EXAMPLE A

In this example, a multi-layer stack of Cu/Co-W-P (1,000 Å)/Ni-P (5,000 Å)/immersion Au (2,000 Å)/electroless Au (3,000 Å–5,000 Å) is formed. The corresponding diffusion barrier structure may also be formed with phosphorus replaced by boron.

EXAMPLE B

In this example, a singular structure is utilized which is represented by Cu/Ni-P(5,000 Å)/immersion Au (1,000–2,000 Å) and Cu/Co-W-P (5,000 Å)/immersion Au (2,000 Å) is presented. The corresponding wirebond structure where phosphorus is replaced by boron may also be formed.

EXAMPLE C

In this example, a multi-layer stack of Cu/Ni-P (5,000 Å)/immersion Au (1,000–2,000 Å)/electroless Pd is provided. The corresponding wirebond structures where phosphorus is replaced by boron may further be utilized.

In practicing the present invention novel method, a copper wafer which contains multiple-layer copper contact pads is first processed by a cleaning step of immersing in a dilute sulfuric acid solution to remove oxides from the copper surface. The wafer is then activated by immersing in a palladium ion solution to create a multitude of Pd metal nuclei on the copper surface. The wafer is then rinsed in sodium citrate or EDTA solution to remove excess Pd nuclei from the substrate and from the inter-pad areas on the wafer surface. The wafer is next immersed in an electroless bath of the present invention whereby a layer of Co-P, Ni-P, Co-W-P, Co-Sn-P and the corresponding alloys containing boron instead of phosphorus is deposited on the copper surface, using in each case a specific bath composition which may be different and unique depending on the type of alloy to be deposited on the copper surface. After an extensive rinsing operation, the wafer is next exposed to an immersion Au solution that is commercially available. Finally, depending on the structures desired, an extra and final layer of electroless Au having a thickness between about 3,000 Å and about 5,000 Å and/or alternatively, a Pd layer of the same thickness can be applied onto the immersion Au layer. A successful wirebond 30 or a solder bump 40 are then formed on top of the multi-layer stack as shown in FIGS. 1 and 2.

The present invention electroless plating method can be carried out by first immersing and activating (by Pd ions) a wafer surface in a heated buffered solution of an electroless bath which contains cobalt ions, boric acid, citrate ions, ppm levels of lead acetate and hypophosphite. The copper pad surface is thus coated with an adherent layer of 1,000~2,000 Å Co-P layer followed by an extensive water rinse. The wafer surface is then immersed into a different heated electroless solution that contains nickel ions, citrate ions, boric acid and sodium hypophosphite, or dimethyl amino borane wherein a layer having a thickness between about 5,000 Å and about 7,000 Å of NiP or NiB, depending on the bath used, is deposited onto the copper followed by extensive water rinse. In the final step of deposition, the wafer surface is immersed in a commercially available immersion Au bath to deposit a new layer of between about 1,000 Å and about 2,000 Å of Au onto the electroless plated copper pad surface 14.

Figure 2:
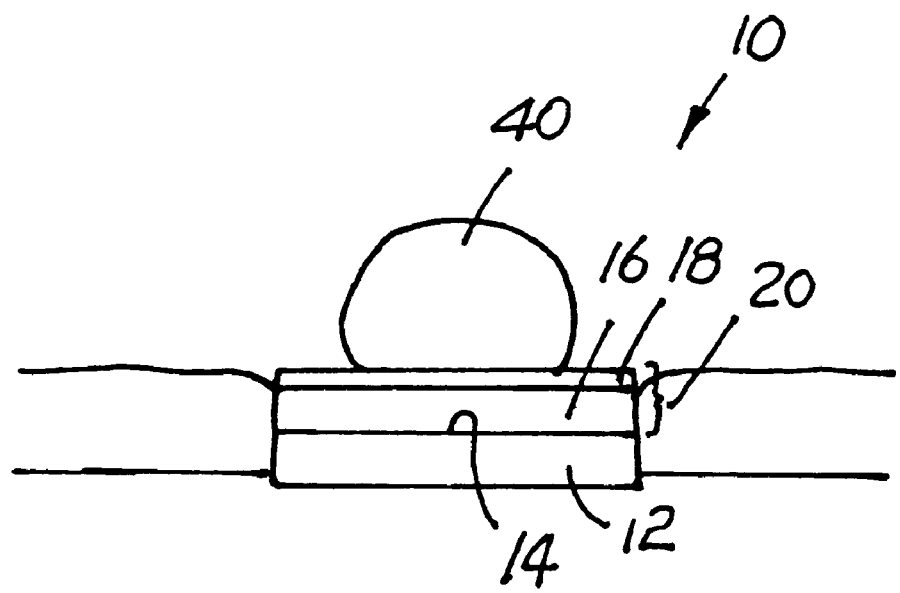
FIG. 2 is an enlarged, cross-sectional view of the present invention copper conductive pad with a solder bump formed on top.

As shown in FIG. 2, a solder bump 40 is deposited on top of the outermost Au layer 18 of a solder material such as Pb/Sn by evaporation, electroplatinq, screen printing or injection molding techniques.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A method for preparing a copper pad surface for electrical connection comprising the steps of:
   providing a copper pad surface;
   selectively depositing a protection layer of phosphorus or boron-containing metal alloy on the copper pad surface; and
   selectively depositing an adhesion layer of a noble metal on top of said protection layer.

2. A method for preparing a copper pad surface for electrical connection according to claim 1 further comprising the step of selectively depositing a nucleation layer of a noble metal on the copper pad surface prior to the deposition of the protection layer.

3. A method for preparing a copper pad surface for electrical connection according to claim 1 further comprising the steps of:
   cleaning the copper pad surface in an acid solution; and
   selectively depositing a nucleation layer of a noble metal on the copper pad surface.

4. A method for preparing a copper pad surface for electrical connection according to claim 2, wherein said nucleation layer is deposited of palladium.

5. A method for preparing a copper pad surface for electrical connection according to claim 3 further comprising the step of rising the copper pad surface with water after said nucleation layer is deposited.

6. A method for preparing a copper pad layer for electrical connection according to claim 1 further comprising the step of depositing said protection layer by an electroless plating technique.

7. A method for preparing a copper pad surface for electrical connection according to claim 1, wherein said step of depositing a protection layer further comprises the steps of:
   contacting said copper pad surface with a heated, buffered solution in an electroless bath that contains cobalt ions, boric acid, citrate ions, lead acetate and hypophosphite; and
   contacting said copper pad surface with a heated electroless solution that contains nickel ions, citrate ions, boric acid, sodium hypophosphite or dimethyl amino borane.

8. A method for preparing a copper pad surface for electrical connection according to claim 1, wherein said adhesion layer is formed of a metal selected from the group consisting of Au, Pt, Pd and Ag.

9. A method for preparing a copper pad surface for electrical connection according to claim 1, wherein said adhesion layer is formed by immersing the wafer in an immersion Au solution.

10. A method for preparing a copper pad surface for electrical connection according to claim 1, wherein said adhesion layer is formed of a noble metal to a thickness between about 500 Å and about 4,000 Å.

11. A method for preparing a copper pad surface for electrical connection according to claim 1, wherein said phosphorus or boron-containing metal alloy is selected from the group consisting of Ni-P, Co-P, Co-W-P, Co-Sn-P, Ni-W-P, Co-B, Ni-B, Co-Sn-B, Co-W-B and Ni-W-B.

12. A method for preparing a copper pad surface for electrical connection according to claim 1, wherein said protection layer is formed of a phosphorus or boron-containing metal alloy to a thickness between about 1,000 Å and about 10,000 Å.

13. A method for preparing a copper pad surface for electrical connection according to claim 1 further comprising the step of depositing a noble metal layer by an electroless plating technique on top of said adhesion layer such that the total thickness of the noble metal layer is between about 2,000 Å and about 12,000 Å.

14. A method for preparing a copper pad surface for electrical connection according to claim 1, wherein said protection layer comprises two separate layers each being a phosphorus or boron-containing metal alloy.

15. A method for preparing a copper pad surface for electrical connection according to claim 1, wherein said protection layer being a composite layer of Co-W-P and Ni-P, said adhesion layer being Au.

16. A method for preparing a copper pad surface for electrical connection according to claim 1, wherein said protection layer being Ni-P or Co-W-P, and said adhesion layer being Au.

17. A method for preparing a copper pad surface for electrical connection according to claim 1, wherein said protection layer being Ni-P, and said adhesion layer being an immersion Au and electroless Pd.

18. A method for preparing a copper pad surface for electrical connection according to claim 2 further comprising the step of depositing a multiplicity of Pd nanoparticles for said nucleation layer.

19. A method for preparing a copper pad surface for electrical connection according to claim 1, wherein said copper pad surface is provided on a substrate selected from the group consisting of a silicon wafer, a silicon-germanium wafer and a silicon-on-insulator wafer.

20. A method for preparing a copper pad surface for electrical connection according to claim 1 further comprising the steps of:

dicing a wafer on which the copper pad surface is situated into individual IC chips; and forming a wirebond onto the copper pad surface.

21. A method for preparing a copper pad surface for electrical connection according to claim 1 further comprising the steps of:

dicing a wafer on which the copper pad surface is situated into IC chips; and forming solder bumps on said copper pad surface for making electrical connections.

22. A method for preparing a copper pad surface for electrical connection according to claim 21, wherein said solder bumps formed are Pb/Sn solder balls by a screen printing or injection molding technique.

23. A conductive pad for forming an electrical connection thereon comprising:

a copper pad surface;

a protection layer of phosphorus or boron-containing metal alloy on the copper pad surface; and an adhesion layer of a noble metal on top of the protection layer, said adhesion layer provides electrical connection with a wirebond or a solder bump.

24. A conductive pad for forming an electrical connection thereon according to claim 23 further comprising a nucleation layer of a noble metal in-between said copper pad surface and said protection layer.

25. A conductive pad for forming an electrical connection thereon according to claim 23 further comprising a nucleation layer of palladium nanoparticles in-between said copper pad surface and said protection layer.

26. A conductive pad for forming an electrical connection thereon according to claim 23, wherein said protection layer is formed of a material selected from the group consisting of Ni-P, Co-P, Co-W-P, Co-Sn-P, Ni-W-P, Co-B, Ni-B, Co-Sn-B, Co-W-B and Ni-W-B.

27. A conductive pad for forming an electrical connection thereon according to claim 23, wherein said protection layer of a phosphorus or boron-containing metal has a thickness between about 1,000 Å and about 10,000 Å.

28. A conductive pad for forming an electrical connection thereon according to claim 23 further comprising a noble metal layer on top of said adhesion layer forming a combined thickness of the noble metal layer between about 2,000 Å and about 12,000 Å.

29. A conductive pad for forming an electrical connection thereon according to claim 23, wherein said protection layer further comprises tAo separate layers each being a phosphorus or boron-containing metal alloy intimately joined together.

30. A conductive pad for forming an electrical connection thereon according to claim 29, wherein said two separate layers being Co-W-P and Ni-P.

31. A conductive pad for forming an electrical connection thereon according to claim 23, wherein said adhesion layer being a layer selected from the group consisting of Au, Pt, Pd and Ag.

32. A conductive pad for forming an electrical connection thereon according to claim 23, wherein said adhesion layer has a thickness between about 500 Å and about 4,000 Å.

33. A conductive pad for forming an electrical connection thereon according to claim 23, wherein said prolection layer being Ni-P or Co-W-P, and said adhesion layer being Au.

34. A conductive pad for forming an electrical connection thereon according to claim 23, wherein said protection layer being Ni-P, and said adhesion layer being an immersion Au and electroless Pd.

35. A conductive pad for forming an electrical connection thereon according to claim 23, wherein said conductive pad being formed on a substrate of a silicon wafer, a silicon-germanium wafer or a silicon-on-insulator wafer.

36. A conductive pad for forming an electrical connection thereon according to claim 23, wherein said elecorical connection is formed by a wirebond.

37. A conductive pad for forming an electrical connection thereon according to claim 23, wherein said electrical connection being formed of a solder bump.

38. An electrical structure for providing electrical connection comprising:

a copper pad surface;

a protection layer of phosphorus or boron-containing metal alloy on the copper pad surface;

an adhesion layer of a noble metal on top of said protection layer; and an electrical connection integral with said adhesion layer.

39. An electrical structure for providing electrical connection according to claim 38, wherein said electrical connection is a wirebond or a solder bump.

40. An electrical structure for providing electrical connection according to claim 38 further comprising a nucleation layer of a noble metal in-between the copper pad surface and the protection layer.

41. An electrical structure for providing electrical connection according to claim 40, wherein said nucleation layer is palladium nanoparticles.

42. An electrical structure for providing electrical connection according to claim 38, wherein said adhesion layer is formed of a metal selected from the group consisting of Au, Pt, Pd and Ag.

43. An electrical structure for providing electrical connection according to claim 38, wherein said protection layer being formed of a metal alloy selected from the group consisting of Ni-P, Co-P, Co-W-P, Co-Sn-P, Ni-W-P, Co-B, Ni-B, Co-Sn-B, Co-W-B and Ni-W-B.

44. An electrical structure for providing electrical connection according to claim 38 further comprising a noble metal layer deposited on top of said adhesion layer such that the total thickness of the noble metal layer is between about 2,000 Å and about 12,000 Å.

45. An electrical structure for providing electrical connection according to claim 38 further comprising a substrate of silicon wafer, a silicon-germanium wafer or a silicon-on-insulator wafer on which the copper pad is situated.

* * * * *